ARRANGEMENT FOR TUNING RECEIVERS TO THE DESIRED OPERATING FREQUENCY
Filed March 12, 1969
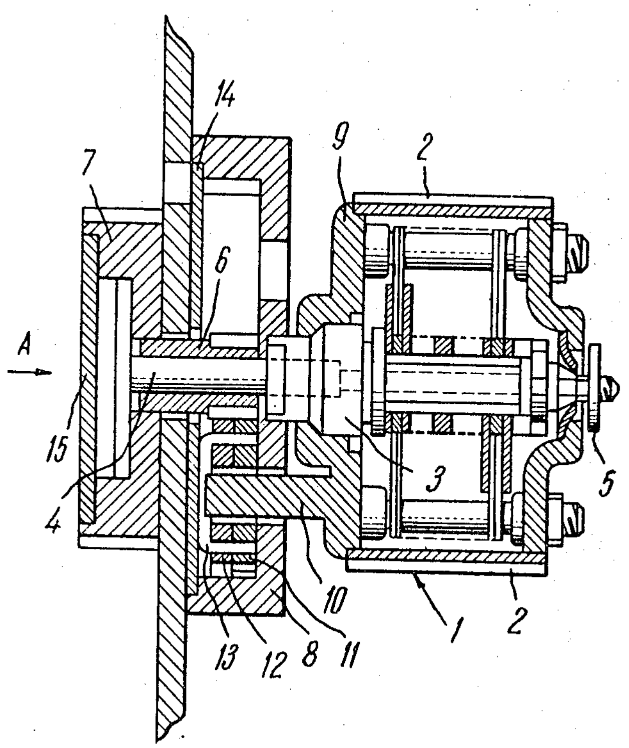

3,564,930
Patented Feb. 23, 1971

3,564,930

ARRANGEMENT FOR TUNING RECEIVERS TO THE DESIRED OPERATING FREQUENCY

Vladimir Petrovich Titov, Ulitsa Pugacheva 64, kv. 11, and Gennady Petrovich Kurilin, Ulitsa K. Marxa 90, kv. 3, both of Sarapul, U.S.S.R.

Filed Mar. 12, 1969, Ser. No. 806,475
Int. Cl. F16h *35/18*
U.S. Cl. 74—10.8 3 Claims

ABSTRACT OF THE DISCLOSURE

An apparatus is provided for tuning radio receivers to a desired operating frequency, and comprises a variable capacitor having a shaft with a bore receiving an auxiliary shaft on which is mounted an external tooth pinion. An internal tooth gear with a slot is fixedly mounted on the shaft of the variable capacitor and a boss on a base of the capacitor passes through a slot in the gear and supports an intermediate gear which is in mesh with the pinion and the internal tooth gear.

The present invention relates to apparatus to tune radio receivers to the desired operating frequency.

There exist apparatus for tuning radio receivers to the desired operating frequency, comprising a variable capacitor and a vernier gear drive mechanism of a planetary type (German Pat. No. 1,112,538, Cl. 214a, 70, 1962).

However, the known tuning apparatus suffer from a number of disadvantages, such as complexity of design, insufficient tuning accuracy, and low reliability in operation.

A particular object of the present invention is to provide an apparatus for tuning radio receivers to the desired operating frequency which is small in size, simple in design, provides high tuning accuracy, and is reliable in service.

With this and other objects in mind, the invention consists in an arrangement for tuning radio receivers to the desired operating frequency, which is made up of a variable capacitor and a vernier mechanism mounted on a common shaft with the capacitor, and in which the vernier mechanism is, according to the invention, a gear transmission whose internal-tooth gear is mounted stationarily on the variable-capacitor shaft and whose external-tooth pinion is mounted on a shaft passing through the bore in the variable-capacitor shaft, while the intermediate gear is mounted on a boss provided on the upper base of the capacitor and passing through a slot in the gear.

The tuning arrangement according to the invention is small in size, simple in design, provides for high tuning accuracy, and is reliable in service.

Other objects and advantages of the invention will be clear from the following description of the invention when read in connection with the accompanying drawing the sole figure of which is a cross-section through apparatus for tuning radio receivers to the desired operating frequency according to the invention.

Referring to the drawing, there is shown an arrangement for tuning radio receivers to the desired operating frequency, which comprises a variable capacitor 1 having slots 2 for mounting on a receiver plate (omitted in the drawing). The shaft 3 of the capacitor 1 has a bore accepting a shaft 4. The shaft 4 is held in place by a pressure washer 5. The shaft 4 supports an external-tooth pinion 6 which has flats for a control knob 7.

The shaft 3 supports an internal-tooth gear 8. The upper base 9 of the capacitor 1 has a boss 10 passing through a slot in the gear 8. According to the invention, the slot is located along an arc of a circle so that the gear 8 is free to rotate through 180°. The boss 10 supports two intermediate gears 11 and 12, displaced relative to each other by a spring 13 and intended to eliminate back-lash in the gear transmission. A circular recess in the gear 8 holds a numbered tuning dial 14. A recess in the control knob 7 receives a bushed index 15 indicating the degree of rotation of the control knob 7.

The tuning arrangement disclosed herein operates as follows.

Rotation of the control knob 7 (FIG. 7) causes the pinion 6 to rotate and to actuate the gear 8 through the intermediate gears 11 and 12. In turn, the gear 8 transmits rotation to the shaft 3 and, consequently, to the plates of the capacitor 1.

The gear 8 rotates in the direction opposite to that of the control knob 7, so that the numbers on the dial 14 are clearly visible (since the operator's hand does not obstruct the view of the dial).

The invention has made it possible to provide a simply designed arrangement for tuning radio receivers to the desired operating frequency, which is small in size (measuring 22 mm. square by 23 mm., which is especially important in miniature receivers) but is highly reliable. With the use of the tuning arrangement disclosed herein, it has become possible to build miniature V.H.F. and U.H.F. radio receivers.

Although the present invention has been described in connection with a preferred embodiment thereof, it is not limited to the details shown, as there may be modifications and adaptations without departure from the concept and scope of the invention, which those in the art will readily understand.

Such modifications and adaptations should be comprehended to be within the range of equivalence of the present invention as set forth in the accompanying claims.

What is claimed is:

1. Apparatus for tuning radio receivers to a desired operating frequency, comprising a variable capacitor including a shaft with a bore; an auxiliary shaft located in the bore of said shaft of the capacitor; an external-tooth pinion mounted on said auxiliary shaft; an internal-tooth gear with a slot fixedly mounted on the shaft of said variable capacitor; said capacitor including an upper base with a boss which passes through the slot in said gear; and an intermediate gear mounted on said boss and in mesh with said pinion and said internal tooth gear.

2. Apparatus as claimed in claim 1 wherein said slot extends through an arc of a circle so that said internal tooth gear is free to rotate through 180°.

3. Apparatus as claimed in claim 1 comprising a tuning dial mounted on said internal tooth gear and an index operatively on said auxiliary shaft facing said tuning dial.

References Cited

UNITED STATES PATENTS

| | | | |
|---|---|---|---|
| 1,461,493 | 7/1923 | Moore | 74—10.8 |
| 2,552,488 | 5/1951 | Klein | 74—10.8 |

MILTON KAUFMAN, Primary Examiner

U.S. Cl. X.R.

74—413; 334—84